United States Patent
Bertrand et al.

(10) Patent No.: US 6,420,919 B2
(45) Date of Patent: Jul. 16, 2002

(54) INTEGRATED CIRCUIT COMPRISING AN OUTPUT TRANSISTOR WITH A CONTROLLED FALL TIME

(75) Inventors: Bertrand Bertrand, Trets; Jean Devin, Le Tholonet, both of (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/742,890

(22) Filed: Dec. 21, 2000

(30) Foreign Application Priority Data

Dec. 23, 1999 (FR) .................................. 99 16563

(51) Int. Cl.[7] .................................................. H03K 5/12
(52) U.S. Cl. ........................................................ 327/170
(58) Field of Search ................................. 327/170, 175, 327/178, 180, 306, 312–315, 321, 322, 325, 327; 361/90, 91

(56) References Cited

U.S. PATENT DOCUMENTS

| 4,318,014 A | | 3/1982 | McAlister et al. ........... 365/104 |
|---|---|---|---|
| 4,649,292 A | * | 3/1987 | Rusznyak ..................... 327/82 |
| 4,874,967 A | * | 10/1989 | Deane .......................... 327/321 |
| 5,023,488 A | * | 6/1991 | Gunning ........................ 326/86 |
| 5,050,127 A | * | 9/1991 | Mitsumoto et al. ..... 365/189.09 |
| 5,216,294 A | | 6/1993 | Ryu .............................. 326/83 |
| 5,973,534 A | * | 10/1999 | Singh ............................ 327/309 |

OTHER PUBLICATIONS

*Off–Chip Driver for Small Computer System Interface*, IBM Technical Disclosure Bulletin, US, IBM Corp., New York, vol. 37, No. 5, May 1, 1994, pp. 239–240, XP000453146, ISSN: 0018-8689.

* cited by examiner

Primary Examiner—Timothy P. Callahan
Assistant Examiner—An T. Luu
(74) Attorney, Agent, or Firm—Lisa K. Jorgenson; Allen, Dyer, Doppelt, Milbrath & Gilchrist, P.A.

(57) ABSTRACT

An integrated circuit electrically is supplied with a voltage and includes an output MOS transistor having a gate driven by an output of a logic circuit and a circuit for biasing the gate of the output MOS transistor. The circuit for biasing the gate is provided for lowering a gate-source bias voltage of the output MOS transistor in a conductive state in relation to the gate-source bias voltage that would otherwise be provided by the output of the logic circuit. The present invention is particularly applicable to output stages for I2C buses.

23 Claims, 2 Drawing Sheets

INTEGRATED CIRCUIT COMPRISING AN OUTPUT TRANSISTOR WITH A CONTROLLED FALL TIME

FIELD OF THE INVENTION

The present invention relates to the field of electronic circuits, and, more particularly, to the control of the electrical characteristics of an output transistor in an integrated circuit.

BACKGROUND OF THE INVENTION

The present invention relates to output transistors, such as MOS transistors, connected to a data bus and presenting a stray capacitance. In particular, the invention relates to controlling a working point in a low state and control time for passing to the low state of such output transistors.

To aid in understanding, FIG. 1 shows schematically a conventional output stage 10 of an integrated circuit 20 (implemented with CMOS technology) connected to the input of a data bus 30 of the I2C type. The output stage 10 includes an inverting gate 11, the output of which drives the gate of an output transistor $T_{OUT}$. The output transistor $T_{OUT}$ may be an NMOS transistor, for example. The inverting gate 11 includes a PMOS transistor $T_1$ and a NMOS transistor $T_0$ connected by their drains. The source of the PMOS transistor $T_1$ receives the supply voltage $V_{cc}$ of the integrated circuit 20, and the source of the NMOS transistor $T_0$ is connected to ground (GND).

The inverting gate 11 receives as an input (i.e., the gates of the transistors $T_0$, $T_1$ receive) Binary data $DT_X$ to be emitted on bus 30, and delivers inverted data $\overline{DT_X}$ on the gate G of the output transistor $T_{OUT}$. A bit at 1 at the output of inverting gate 11 corresponds to the application of a voltage $V_{cc}$ to the gate of the transistor $T_{OUT}$ (i.e., the transistor $T_1$ is conductive) and a bit at 0 corresponds to the connection of the gate of transistor $T_{OUT}$ to ground (i.e., the transistor $T_0$ is conductive).

The transistor $T_{OUT}$ is connected by its drain D to the data transmission line 31 of the bus 30, and its source S is connected to ground. The bus 30, as seen from its input, presents a stray capacitance $C_{BUS}$ between transmission line 31 and ground. When the transistor $T_{OUT}$ is in the OFF state, the line 31 is maintained by default at 1 by a bias or pull-up resistor $R_{BUS}$ receiving a bias voltage $V_1$. In practice, the voltage $V_1$ may be equal to $V_{cc}$ and is, for example, about 5V.

When the transistor $T_{OUT}$ receives a bit at 1 on its gate (i.e., the voltage $V_{cc}$), the transistor $T_{OUT}$ becomes conductive, the capacitance $C_{BUS}$ discharges and the output of stage 10 passes to 0. The discharge time is designated $T_{FALL}$. An output 0 corresponds to a drain-source voltage $V_{DS}$ and a drain-source current $I_{DS}$ having stable values designated respectively by $V_{OL}$ and $I_{OL}$ and defining the working point in the low state of the transistor $T_{OUT}$.

For historical reasons relating to the use of bipolar transistors in input or output stages of integrated circuits, the industrial specifications of I2C buses require a rather low voltage $V_{OL}$ on the order of 0.2 to 0.4 V, and a rather high current $I_{OL}$ on the order of 0.7 to 3 mA. With MOS technology, such a working point may be achieved only with an NMOS transistor having a gate width W much larger than the gate length L, i.e., a ratio W/L clearly larger than 1.

With the saturation current $I_{SAT}$ of a MOS transistor being proportional to the ratio W/L, the transistor $T_{OUT}$ is thus traversed by a significant current during its switching, the capacitance $C_{BUS}$ discharges almost instantaneously, and the time for passing to 0 $T_{FALL}$ is very short. However, the fact that the time $T_{FALL}$ is very short generates an undesirable electronic noise in transmission line 31. It is thus desirable that the time $T_{FALL}$ be lengthened to at least about 20 ns.

However, in an output stage 10 as described above, obtaining a rather long time $T_{FALL}$ is incompatible with obtaining a low voltage $V_{OL}$ and a rather high current $I_{OL}$. As a matter of fact, the discharge of the capacitance $C_{BUS}$ is basically provided by the transistor current in the saturated state, or the current $I_{SAT}$. Thus, if the ratio W/L of the transistor is decreased to limit the discharge the current $I_{SAT}$ of the capacitance $C_{BUS}$, the voltage $V_{OL}$ is increased at the same time as the current $I_{OL}$ is decreased.

SUMMARY OF THE INVENTION

An object of the present invention is to provide a method for lengthening the time $T_{FALL}$ for passing to zero of an output transistor of the type described above, without modifying its working point $V_{OL}$, $I_{OL}$ in the low state.

Another object of the present invention is to provide such an output stage including a controller for controlling the fall time of the output transistor when it is connected to a capacitive data bus.

These objects are achieved by a method of lengthening the time for passing to zero a signal on a terminal of an output transistor of the MOS type connected to a data transmission line presenting a predetermined electric capacitance while keeping a substantially identical working point in the low state of the transistor and where the gate of the transistor is driven by a logic circuit present in an integrated circuit receiving a predetermined supply voltage. The method includes lowering the gate-source bias voltage of the transistor in the conductive state in relation to the gate-source bias that would otherwise appear at the output of the logic circuit. The transistor may be designed with an increased width over length ratio of the gate of the transistor for keeping the initial working point in the low state.

Moreover, the method may include connecting the gate of the transistor to a gate bias circuit. The gate bias circuit may be arranged to reduce the voltage in the high state delivered by the logic circuit on the gate of the transistor. Specifically, the gate bias circuit may include a first MOS transistor substantially identical to the output transistor and arranged as a diode, and a native transistor arranged as a diode and arranged in series with the first MOS transistor. Furthermore, a gate-source bias voltage lower than 2 V may be applied to the output transistor for turning it on.

The present invention also relates to an integrated circuit electrically supplied with a predetermined voltage and including an output MOS transistor, a logic circuit providing an output for driving a gate of the output MOS transistor, and a circuit for biasing the gate of output MOS transistor. Accordingly, the gate-source bias voltage of the transistor is lowered in the conductive state in relation to the gate-source bias voltage that would otherwise be present at the output of the logic circuit.

More specifically, the gate-source bias voltage of the transistor in the conductive state may be lower than 2 V. The bias circuit may be arranged to reduce the voltage in the high state delivered by the logic circuit. Also, the bias circuit may include at least a first MOS transistor arranged as a diode and substantially identical to the output transistor. The bias circuit may also include a native transistor arranged as a diode and in series with the first MOS transistor.

Furthermore, the output transistor may have a width over length ratio of the gate that gives to it a working point in the low state in accordance with the specifications of I2C buses and a fall time of the output signal at least equal to 20 nanoseconds. In practice, the integrated circuit may take the form of an EEPROM memory, for example, and the output stage may be arranged for delivering data read in the memory.

BRIEF DESCRIPTION OF THE DRAWINGS

These objects, characteristics and advantages of the present invention will be described with more detail in the following description of the method according to the invention and an embodiment of an output stage according to the invention, given by way of non-limitative example, in conjunction with the accompanying drawings, in which.

DETAILED DESCRIPTION OF THE PREFERRED EMBODIMENTS

Figure 1:
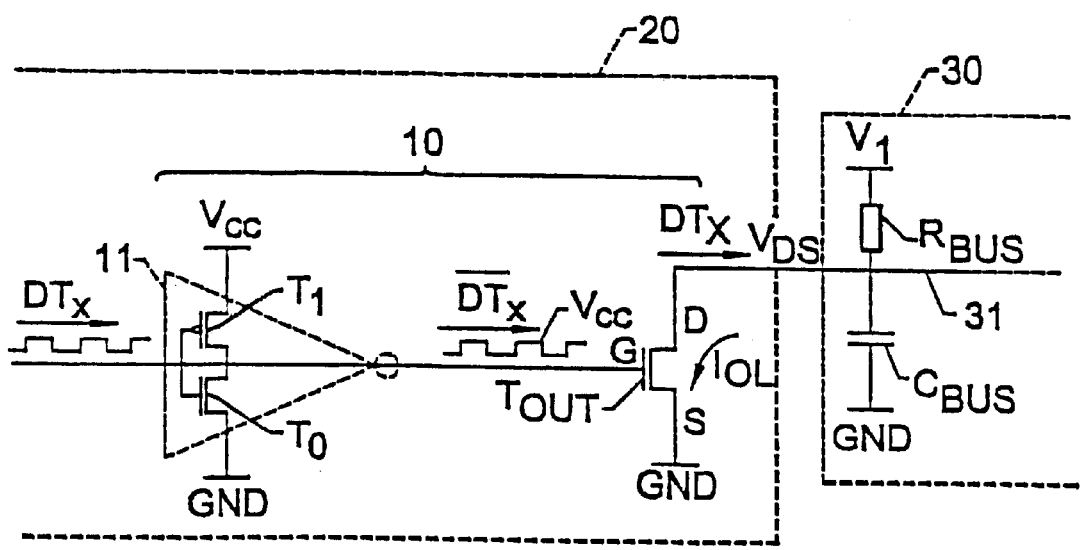
FIG. 1, previously described, is a schematic diagram of a conventional series output stage of an integrated circuit according to the prior art.

As noted above, the achievement of a rather long time $T_{FALL}$ in the output stage 10 represented in FIG. 1 is in practice incompatible with the achievement of a working point including a rather low voltage $V_{OL}$ and a rather high current $I_{OL}$. This paradox will be better understood in relation to FIG. 2, which shows the current/voltage graph IDS=f($V_{DS}$) of the output transistor $T_{OUT}$. When the gate of transistor $T_{OUT}$ receives voltage $V_{cc}$ delivered by the transistor $T_1$ of the inverting gate 11 (FIG. 1), the transistor $T_{OUT}$ progressively turns on. That is, the transistor $T_{OUT}$ passes from the saturated state to the linear state and its drain-source voltage $V_{DS}$ slides along graph $C_1$ from its initial value, which is the bias voltage $V_1$ of bus 31, to the value $V_{OL}$. During the first part of the discharge period of capacitance $C_{BUS}$, the transistor is in the saturated state because the voltage $V_{DS}$ is above the differential gate voltage $V_{GS}-V_T$. The current $I_{DS}$, conventionally designated $I_{SAT}$, is constant and follows the conventional equation:

$$I_{DS}=I_{SAT}=(K_P/2)(W/L)(V_{GS}-V_T)^2 \tag{1}$$

where $K_P$ is a constant (representing mobility of the carriers), $V_T$ is the threshold voltage of the transistor, and $V_{GS}$ is the gate voltage. The gate voltage $V_{GS}$ being equal to $V_{cc}$, equation (1) may also be written:

$$I_{DS}=I_{SAT}=(K_P/2)(W/L)(V_{cc}-V_T)^2 \tag{2}$$

During the second part of the discharge period, the voltage $V_{DS}$ becomes lower than the differential gate voltage $V_{cc}-V_T$. Transistor $T_{OUT}$ then works in the linear mode, and the drain-source current $I_{DS}$ follows the conventional equation:

$$I_{DS}=K_P(W/L)(V_{cc}-V_T)V_{DS} \tag{3}$$

Figure 2:
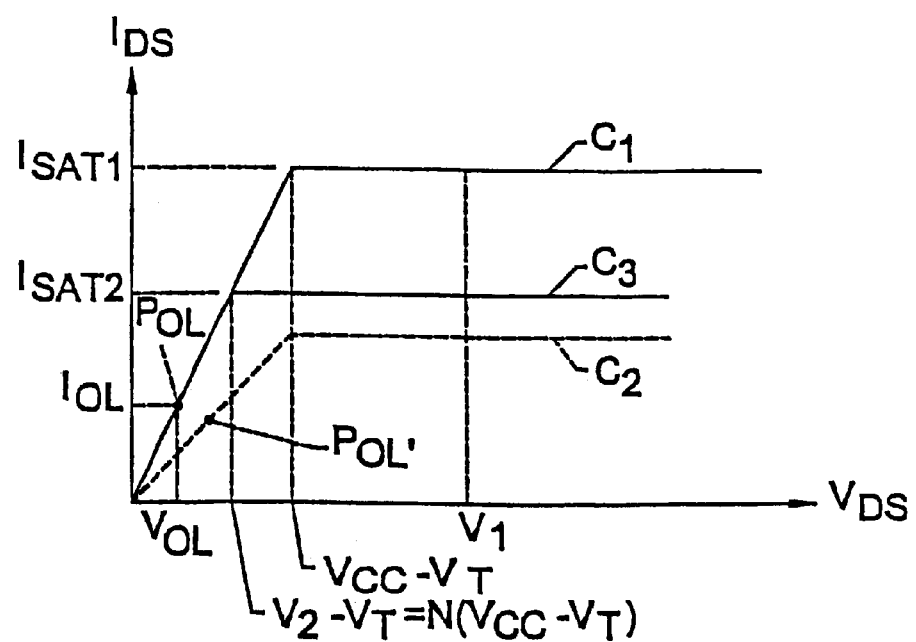
FIG. 2 is a graph illustrating current/voltage curves for a conventional output transistor according to the prior art and an output transistor according to the present invention.

When the capacitance $C_{BUS}$ is completely discharged, the transistor presents the working point $P_{OL}$ represented in FIG. 2, defined by the specific values $I_{OL}$ and $V_{OL}$ of its drain-source current $I_{DS}$ and its drain-source voltage $V_{DS}$. At the working point $P_{OL}$, equation (3) may be written as:

$$I_{OL}=K_P(W/L)(V_{cc}-V_T)V_{OL} \tag{4}$$

At the working point $P_{OL}$, the voltage at the terminals of resistor $R_{BUS}$ and the voltage at the terminals of transistor $T_{OUT}$ are bound with the following equation:

$$V_1=R_{BUS}*I_{OL}+V_{OL} \tag{5}$$

Thus, combining equations (4) and (5):

$$V_1=R_{BUS}I_{OL}+I_{OL}/[K_P(W/L)(V_{cc}-V_T)] \tag{6}$$

It may be deduced therefrom that the value of $I_{OL}$ is:

$$I_{OL}=V_1/[R_{BUS}+1/[K_P(W/L)(V_{cc}-V_T)]] \tag{7}$$

Combining equations (5) and (7), it may also be deduced the value of $V_{OL}$ is:

$$V_{OL}=V_1/[1+(R_{BUS}K_P(W/L)(V_{cc}-V_T)] \tag{8}$$

In equations (7) and (8), parameters $V_1$, $V_{cc}$, $R_{BUS}$ are imposed by the environment of the output transistor $T_{OUT}$. For lengthening the time $T_{FALL}$, a solution could include decreasing the ratio W/L of the transistor. This would allow the limitation of the discharge current $I_{SAT}$ of capacitance $C_{BUS}$ during the saturation period (equation 2), and the limitation of the current $I_{DS}$ during the linear period (equation 3). However, equations (7) and (8) also show that a decrease of the parameter W/L would lead to a clear increase of voltage $V_{OL}$ and a small decrease of current $I_{OL}$. The working point $P_{OL}$ would thus slide towards a working point $P_{OL}'$ on a graph $C_2'$ represented in FIG. 2, which does not satisfy the industrial specifications.

Furthermore, the working point $P_{OL}$ provided by the industrial specifications imposes the ratio W/L of the transistor, and thus imposes the saturation current $I_{SAT}$. Providing a voltage $V_{OL}$ and a current $I_{OL}$ in accordance with the specifications is contradictory with providing a longer discharge time $T_{FALL}$ which would allow the decrease of the switching noise.

The present invention provides for a decrease of the saturation current $I_{SAT}$ of the output transistor $T_{OUT}$ without substantially offsetting the working point $P_{OL}$. Furthermore, the bias voltage VGS of the source of transistor $T_{OUT}$ is decreased while the ratio W/L is increased (instead of decreasing it). Before describing an example of implementation of this method, the theory of the method will be first explained.

The current $I_{OL1}$ and the saturation current $I_{SAT1}$ of the conventional transistor $T_{OUT}$ are given by the following equations (9) and (10) below, in which the characteristics previously indicated by $I_{OL}$, $V_{OL}$, W/L, $I_{SAT}$ are now designated $I_{OL1}$, $V_{OL1}$, $W1/L_1$, $I_{SAT1}$:

$$I_{OL1}=K_P(W_1/L_1)(V_{cc}-V_T)V_{OL1} \tag{9}$$

$$I_{SAT1}=(K_P/2)(W_1/L_1)(V_{cc}-V_T)^2 \tag{10}$$

Furthermore, the following equations (11) and (12) relate respectively to the current $I_{OL2}$ and the saturation current ISAT$_2$ of a transistor according to the invention, having its gate biased by a voltage $V_2$ different from $V_{cc}$, and having its drain still biased by the voltage $V_1$ of bus 30:

$$I_{OL2}=K_P(W_2/L_2)(V_2-V_T)V_{OL2} \tag{11}$$

$$I_{SAT2} = (K_P/2)(W_2/L_2)(V_2-V_T)^2 \qquad (12)$$

According to the invention, it is desired that:

$$I_{OL2} = I_{OL1} = I_{OL} = \text{Constant} \qquad (13)$$

$$V_{OL2} = V_{OL1} = V_{OL} = \text{Constant} \qquad (14)$$

while satisfying the following equation:

$$I_{SAT2} = N \cdot I_{SAT1} \qquad (15)$$

This is because it is desired to lengthen the discharge time $T_{FALL}$, where N is a number lower than 1 (ranging between 0 and 1). Combining equations (9) (11) (13) and (14), the following equation results:

$$K_P(W_1/L_1)(V_{cc}-V_T)V_{OL} = K_P(W_2/L_2)(V_2-V_T)V_{OL} \qquad (16)$$

that is:

$$V_2-V_T = (W_1/L_1)(L_2/W_2)(V_{cc}-V_T) \qquad (17)$$

Combining equations (10) (12) and (17):

$$(W_2/L_2)(V_2-V_T)^2 = N(W_1/L_1)(V_{cc}-V_T)^2 \qquad (18)$$

Introducing equation (17) into equation (18):

$$(W_2/L_2)[(W_1/L_1)(L_2/W_2)(V_{cc}-V_T)]^2 = N(W_1/L_1)(V_{cc}-V_T)^2 \qquad (19)$$

that is:

$$W_2/L_2 = (1/N)(W_1/L_1) \qquad (20)$$

Introducing equation (20) into equation (17) results in the following:

$$V_2-V_T = N(V_{cc}-V_T) \qquad (21)$$

Thus, according to the invention, decreasing the differential gate voltage $V_{cc}-V_T$ by the factor N to obtain a differential gate voltage $V_2-V_T$ in response to equation (21), and increasing in parallel, by the inverse factor 1/N, the ratio $W_1/L_1$ of a conventional transistor to obtain a ratio $W_2/L_2$ in response to equation (20), allows the design of a transistor having a saturation current $I_{SAT2}$ decreased by factor N in relation to the saturation current $I_{SAT1}$ of a conventional transistor. This is the case even while keeping the working point $P_{OL}$ ($V_{OL}$, $I_{OL}$) of the conventional transistor imposed by the industrial specifications.

The current/voltage graph $C_3$ of such a transistor according to the present invention may be seen in FIG. 2. The graph $C_3$ presents a saturation current $I_{SAT2}$ much lower than current $I_{SAT1}$ (i.e., the flat part of the graph) but keeps a linear part identical to the linear part of graph $C_1$ when the drain-source voltage $V_{DS}$ ranges between $V_{OL}$ and $V_2-V_T$. Such a transistor limits the saturation current that provides a large part of the discharge of the capacitance $C_{BUS}$. The increase of the time $T_{FALL}$ is equal to the ratio between the surface defined by graph $C_1$ between the voltages $V_{OL}$, $V_1$ and the surface defined by graph $C_3$ between the voltages $V_{OL}$, $V_1$.

Figure 3:
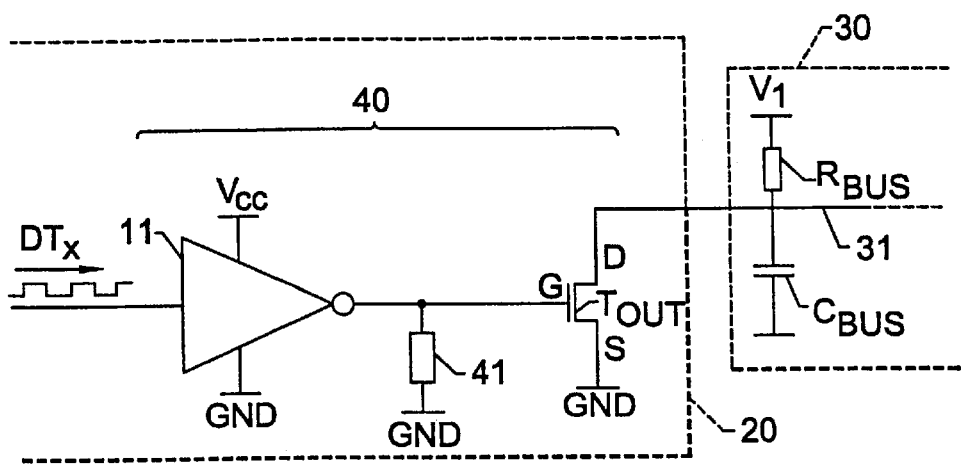
FIG. 3 is a schematic diagram illustrating an output stage according to the present invention.

An output stage 40 according to the present invention is shown in FIG. 3. The output stage 40 is similar to the stage 10 of FIG. 1 except that a bias circuit according to the invention, represented in the form of a block 41, is connected between the gate of the transistor $T_{OUT}$ and ground. When the transistor $T_1$ of the inverting gate 11 is conductive, the circuit 41 regulates the gate of the transistor and imposes a voltage $V_2$ in response to equation (21) above. N is chosen to obtain a time $T_{FALL}$ which does not generate an undesirable switching noise, and $T_{FALL}$ is preferably above 20 ns.

Figure 4:
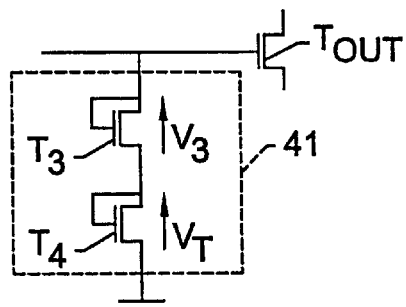
FIG. 4 is a schematic diagram of an exemplary embodiment of a bias circuit according to the present invention.

According to an advantageous embodiment illustrated in FIG. 4, the bias circuit 41 includes an element $T_3$ and a transistor $T_4$ arranged as diodes and connected in series. The transistor $T_4$ has substantially the same structure and size as the transistor $T_{OUT}$. In these conditions, the voltage $V_2$ at the terminals of circuit 41, applied to the gate of transistor $T_{OUT}$, is equal to:

$$V_2 = V_3 + V_T \qquad (22)$$

where $V_T$ is the threshold voltage of the diode transistor $T_4$, and $V_3$ is a voltage appearing at the terminals of element $T_3$.

With this arrangement, the temperature variations of the threshold voltage $V_T$ of transistor $T_{OUT}$ are partly compensated by the voltage $V_2$. The threshold voltage $V_T$ of the transistor $T_4$ is identical and varies in the same way as the threshold voltage $V_T$ of the transistor $T_{OUT}$. Thus, the differential gate voltage $V_2-V_T$ of the transistor $T_{OUT}$ is given by:

$$V_2-V_T = (V_3+V_T)-V_T = V_3 \qquad (23)$$

and only depends on the voltage $V_3$. The element $T_3$ may be a reference element providing a stable voltage according to temperature or, more simply, a native NMOS transistor arranged as a diode, the threshold voltage $V_{TNAT}$ of which is lower that the one of an enhanced transistor.

In these conditions, for a voltage $V_{cc}$ of about 5 V, a voltage $V_T$ of 0.7 V and a voltage $V_{TNAT}$ of 0.4 V, the voltage $V_2$ imposed by the bias circuit 41 allows the reduction of about 74% of the differential gate voltage in relation to the value that it would have in the absence of circuit 41. A decrease in the same proportions of the saturation current $I_{SAT}$ is also provided. This results from the following calculations:

$$V_3 = V_{TNAT} + V_T = N(V_{cc}-V_T) \qquad (24)$$

that is:

$$N = (V_{TNAT}+V_T)/(V_{cc}-V_T) \qquad (25)$$

that is:

$$N = 0.26 \qquad (26)$$

It will be apparent to those skilled in the art that the present invention is likely to have various alternative embodiments and applications. For example, the present invention may also be applied when the bias resistor of the drain of transistor $T_{OUT}$ is a resistor arranged in the output stage 10 instead of being the resistor $R_{BUS}$. The drain bias voltage will then be the voltage $V_{cc}$ instead of the voltage $V_1$ (although in practice $V_1$ and $V_{cc}$ are generally identical).

Furthermore, although the bias circuit 41 is shown as connected to the gate of transistor $T_{OUT}$ in FIG. 3, it is also possible to connect this circuit in another point of the output stage. For example, the inverting gate 11 could be supplied with a regulated voltage lower than voltage $V_{cc}$ and deliver, in the high state, a gate voltage $V_{GS}$ in response to equation 21 above.

Additionally, although the technical problem having led to the implementation of the present invention relates to buses of the I2C type, the present invention is not limited to such an application and may relate to other data transmission lines of the capacitive type.

Figure 5:
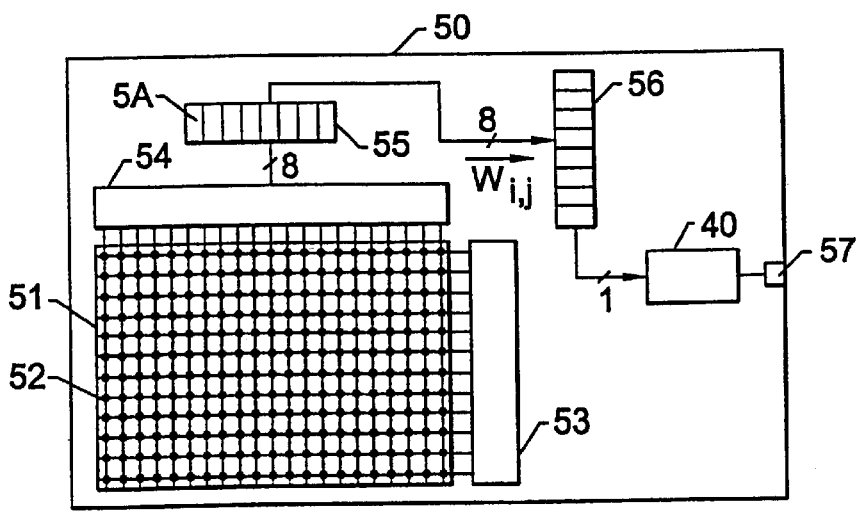
FIG. 5 is a schematic block diagram of an EEPROM memory illustrating an application of the present invention.

An application of the present invention to electrically erasable and programmable memories, or EEPROM memories, provided with a serial output for a bus I2C is illustrated in FIG. 5. The EEPROM memory 50, represented very schematically in FIG. 5, includes a memory array 51 including memory cells 52 arranged in lines and columns, a line decoder 53, a column decoder 54, and a read circuit 55 connected to the column decoder. Read circuit 55 includes sense amplifiers 5A for delivering binary words $W_{i,j}$ read in the memory array 51, e.g., bytes. The binary words $W_{i,j}$ are applied to a register 56 with a serial output and parallel loading. The serial output of the register 56 is sent to an output terminal 57 of the memory 50 by an output stage 40 as described above.

That which is claimed is:

1. An integrated circuit comprising:
    an output MOS transistor having a gate;
    a logic circuit providing an output for driving the gate of said output MOS transistor; and
    a biasing circuit for biasing the gate of said output MOS transistor and lowering a gate-source bias voltage of said output MOS transistor when in a conductive state relative to a gate-source bias voltage that would otherwise be present based upon the output of said logic circuit.

2. The integrated circuit according to claim 1 wherein the gate-source bias voltage of said output MOS transistor in the conductive state is less than 2 V.

3. The integrated circuit according to claim 1 wherein the gate of said output MOS transistor has a width to length ratio such that said output MOS transistor provides an output signal of about 0.2 to 0.4 V and about 0.7 to 3 mA in the low state and having a fall time of at least 20 nanoseconds.

4. The integrated circuit according to claim 1 wherein said biasing circuit is arranged to reduce the voltage delivered by said logic circuit in a high state.

5. The integrated circuit according to claim 4 wherein said biasing circuit comprises a first MOS transistor arranged as a diode and that is substantially identical to said output MOS transistor.

6. The integrated circuit according to claim 5 wherein said bias circuit comprises a native transistor arranged as a diode and connected in series with said first MOS transistor.

7. A method of lengthening a time for passing to zero of a signal at a terminal of an output MOS transistor while keeping a substantially identical working point in a low state of the output MOS transistor, and the terminal being connected to a data transmission line having a capacitance, and a gate of the output MOS transistor being driven by a logic circuit receiving a supply voltage, the method comprising:
    driving a gate of the output MOS transistor using a logic circuit receiving a supply voltage;
    lowering a gate-source bias voltage of the output MOS transistor in a conductive state relative to a gate-source bias voltage that would otherwise be provided at the output of the logic circuit; and
    providing an increased width to length ratio of the gate of the output MOS transistor for keeping an initial working point in the low state of the output MOS transistor.

8. The method according to claim 7 further comprising connecting the gate of the transistor to a gate bias circuit.

9. The method according to claim 8 wherein the gate bias circuit reduces the voltage in a high state of the output MOS transistor delivered by the logic circuit on the gate of the output MOS transistor.

10. The method according to claim 9 wherein the gate bias circuit comprises a first MOS transistor substantially identical to the output MOS transistor and arranged as a diode, and a native transistor arranged as a diode and connected in series with the first transistor.

11. The method according to claim 7 wherein the gate-source bias voltage applied to the output transistor for turning on the transistor is lower than 2 V.

12. A method of lengthening a time for switching a signal at a terminal of an output MOS transistor comprising:
    providing an output from a logic circuit for driving a gate of the output MOS transistor; and
    biasing the gate of the output MOS transistor and lowering a gate-source bias voltage of the output MOS transistor when in a conductive state relative to a gate-source bias voltage that would otherwise be present based upon the output of the logic circuit.

13. The method according to claim 12 wherein biasing comprises arranging a biasing circuit to reduce a voltage of the output for driving a gate of the output MOS transistor in a high state.

14. The method according to claim 13 wherein the biasing circuit comprises a first MOS transistor arranged as a diode and that is substantially identical to the output MOS transistor.

15. The method according to claim 14 wherein the biasing circuit comprises a native transistor arranged as a diode and connected in series with the first MOS transistor.

16. The method according to claim 12 wherein the gate-source bias voltage of the output MOS transistor in the conductive state is less than 2 V.

17. The method according to claim 16 wherein the gate of the output MOS transistor has a width to length ratio such that the signal has a voltage of about 0.2 to 0.4 V and about 0.7 to 3 mA in the low state and a fall time of at least 20 nanoseconds.

18. A memory comprising:
    at least one memory cell; and
    an output stage for providing data read from the at least one memory cell comprising
        an output MOS transistor having a gate,
        a logic circuit providing an output for driving the gate of said output MOS transistor, and
        a biasing circuit for biasing the gate of said output MOS transistor and lowering a gate-source bias voltage of said output MOS transistor when in a conductive state relative to a gate-source bias voltage that would otherwise be present based upon the output of said logic circuit.

19. The memory according to claim 18 wherein said biasing circuit is arranged to reduce the voltage delivered by said logic circuit in a high state.

20. The memory according to claim 18 wherein said biasing circuit comprises a first MOS transistor arranged as a diode and that is substantially identical to said output MOS transistor.

21. The memory according to claim 20 wherein said bias circuit comprises a native transistor arranged as a diode and connected in series with said first MOS transistor.

22. The memory according to claim 18 wherein the gate of said output MOS transistor has a width to length ratio such that said output MOS transistor provides an output signal of about 0.2 to 0.4 V and about 0.7 to 3 mA in the low state and having a fall time of at least 20 nanoseconds.

23. The memory according to claim 18 wherein the memory is an EEPROM memory.

* * * * *

UNITED STATES PATENT AND TRADEMARK OFFICE
CERTIFICATE OF CORRECTION

PATENT NO.    : 6,420,919 B2                                            Page 1 of 1
DATED         : July 16, 2002
INVENTOR(S)   : Bertrand Bertrand and Jean Devin It is certified that error appears in the above-identified patent and that said Letters Patent is hereby corrected as shown below:

Column 4,
Line 23, delete "$V_{OL} = V_1/[1+(R_{BUS} K_P(W/L)(V_{cc}-V_T)]$" insert -- $V_{OL} = V_1/[1+(R_{BUS} K_P (W/L)(V_{cc}-V_T))]$ --
Line 46, delete "$P_{OL}$ Furthermore" insert -- $P_{OL}$. Furthermore --

Coumn 5,
Line 22, delete "Combining equations (10) (12) and (17):" insert -- Combining equations (10) (12) and (15): --

Signed and Sealed this

Fourth Day of February, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,420,919 B2
DATED : July 16, 2002
INVENTOR(S) : Bertrand Bertrand and Jean Devin It is certified that error appears in the above-identified patent and that said Letters Patent is hereby corrected as shown below:

<u>Column 7,</u>
Line 47, delete, "having a capacitance, and a gate of the output MOS transistor being driven by a logic circuit receiving a supply voltage, the method comprising" insert
-- having a capacitance, the method comprising --

Signed and Sealed this

Thirteenth Day of May, 2003

JAMES E. ROGAN
*Director of the United States Patent and Trademark Office*